US006420253B2

(12) United States Patent
Appelt et al.

(10) Patent No.: US 6,420,253 B2
(45) Date of Patent: Jul. 16, 2002

(54) METHOD FOR PREVENTING ADHESIVE BLEED ONTO SURFACES

(75) Inventors: Bernd K. Appelt, Brackney, PA (US); Gary A. Johansson, Hockessin, DE (US); Gerald W. Jones, Apalachin, NY (US); Luis J. Matienzo, Endicott, NY (US); Yenloan H. Nguyen, Binghamton, NY (US); Konstantinos I. Papathomas, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/881,466

(22) Filed: Jun. 14, 2001

Related U.S. Application Data

(62) Division of application No. 09/537,959, filed on Mar. 28, 2000, now Pat. No. 6,252,307.

(51) Int. Cl.[7] .............................................. H01L 21/44
(52) U.S. Cl. ..................... 438/612; 438/612; 257/784
(58) Field of Search ...................... 438/118, 124–127, 438/64, 25–26, 612

(56) References Cited

U.S. PATENT DOCUMENTS

| 4,638,116 A | 1/1987 | Gumb ........................ 174/68.5 |
| 4,803,124 A | 2/1989 | Kunz .......................... 428/200 |
| 5,514,501 A | 5/1996 | Tarlov ............................ 430/5 |
| 5,523,878 A | 6/1996 | Wallace eta l. ............. 359/290 |
| 5,719,087 A | 2/1998 | Chen et al. ................ 4389/612 |
| 5,731,547 A | 3/1998 | Derwin et al. .............. 174/251 |
| 5,900,160 A | 5/1999 | Whitesides et al. ........... 216/41 |

*Primary Examiner*—David Nelms
*Assistant Examiner*—Dung Anh Le
(74) *Attorney, Agent, or Firm*—William N. Hogg

(57) ABSTRACT

A method and structure is provided for preventing wetting or bleed of an adhesive, such as an epoxy, onto noble metal wire bond pads on the surface of a dielectric substrate when attaching an I/C chip to the substrate. The method includes treating the wire bond pads with a chemical composition which prevents bleeding onto the surfaces of the wire bond pads by a component of the epoxy. The chemical composition is a chemical which will provide "Self-Assembled Monolayers" (SAMs) on the surface of the gold. These compositions are characterized by a molecule having at least one group, such as a mercaptan or disulfide, connected to a hydrocarbon moiety, such as a $(CH_2)_x$ chain. The affinity of the thiol or sulfur-containing portion of the molecule chemically bonding with the noble metal provides a relatively strong attachment of the molecule to the metal surface. The hydrocarbon segment presents a surface on the noble metal that has the characteristics of the hydrocarbon portion of the molecule which has a low surface tension, and, thus, prevents wetting of the noble metal by an epoxy adhesive component. The SAMs, once they provide protection from the bleed of the die attach adhesives, self desorb during the wire bonding or soldering temperatures.

13 Claims, 3 Drawing Sheets

METHOD FOR PREVENTING ADHESIVE BLEED ONTO SURFACES

CROSS REFERENCE TO RELATED APPLICATION

This application is a divisional of application Ser. No. 09/537,959, filed Mar. 28, 2000 now U.S. Pat. No. 6,252,307.

BACKGROUND OF THE INVENTION

1. Field of the Invention

This invention relates generally to the prevention of bleeding of organic material onto a metal substrate and, more particularly, to preventing bleeding of adhesive or components thereof onto a noble metal substrate. In even more particular aspects, this invention relates to the prevention of the bleeding of any components of a die attach adhesive onto noble metal circuitry on a dielectric substrate and, specifically, onto gold wire bond surfaces on a chip carrier or other noble metal circuitry on an I/C chip mounting substrate.

2. Background Information

In the mounting of integrated circuit (I/C) chips on substrates having electrical connections, such as wire bond pads thereon, one technique of mounting utilizes a two-part epoxy adhesive to bond the chip either to gold plating on a planar surface of a substrate, or onto copper or some dielectric material in a cavity formed in an electrical substrate, which substrate also has electrical contacts or wire bond surfaces on the surface thereof. One particular problem encountered when using such bond techniques is the tendency of the components of the epoxy adhesive to "bleed" and spread onto the wire bond surfaces, such as the wire bond pads or other noble metal surfaces, such as ground rings or voltage rings, and adhere thereto. This "bleed" causes the surface of the bond pads or other metal surfaces to be unreceptive to the bonding of the wire bonds necessary to electrically connect the wire bond surfaces to the contacts on the I/C chip. This, of course, results in unsatisfactory electrical contacts and, thus, contributes to an unsatisfactory chip package.

One prior art technique for solving this problem is to treat the part with a $CF_4$ plasma. The plasma reacts with the organic portion of the substrate, and the fluorine containing moieties settle on the gold surface of the wire bond pads and other gold surfaces and make them less susceptible to being wetted by bleed from the adhesive. However, this is not a completely satisfactory treatment in all instances in that the fluorine containing moieties are not strongly bonded to the gold but are only lightly adhered thereto. Therefore, they can be easily removed with organic solvents during processing before attachment of the I/C chip takes place, but not easily removed with aqueous systems during processing. Moreover, the $CF_4$ plasma tends, in many cases, to adversely affect the dielectric material for subsequent application of encapsulating material.

It is, therefore, an object of the present invention to provide a method and structure for substantially reducing or eliminating the wettability of metal surfaces, particularly noble metal surfaces, and specifically gold or other noble metal surfaces, to organic materials, particularly any components of an adhesive, such as an epoxy used for attaching an I/C chip to a substrate, and which I/C chip is subsequently bonded thereto.

SUMMARY OF THE INVENTION

According to the present invention, a method and structure for preventing wetting or bleed of an adhesive, such as an epoxy, onto a metal surface and particularly wire bond surfaces on the surface of a dielectric substrate is provided. This invention is particularly useful in preventing bleed from any components of an adhesive for attaching an I/C chip or a die to a substrate, and more particularly when a two-part epoxy adhesive is used. The method includes treating the surfaces of the wire bond pads with a chemical composition that prevents wetting of, or bleed onto, the wire bond surfaces by a component of the epoxy used to attach the die to the substrate surface. The chemical composition is a chemical which will provide "Self-Assembled Monolayers" (SAMs) on the surface of the gold. These compositions are characterized by a molecule having at least one group, such as a mercaptan or disulfide, connected to a hydrocarbon or substituted hydrocarbon moiety, such as $(CH_2)_n$ chain. A particular molecule that is useful for this is 1-octadecanethiol [HS—$(CH_2)_{17-CH_3}$]. The thiol or sulfur-containing portion of the molecule has an affinity for gold or other noble metals, such as palladium, platinum and silver, and chemically bonds to the metal surface, leaving the hydrocarbon segment oriented away from the surface. The affinity of the thiol or sulfur-containing portion of the molecule chemically bonding with the metals provides a relatively strong attachment of the molecule to the metal surface. The hydrocarbon segment oriented away from the surface presents a surface on the metal which has the characteristics of the hydrocarbon portion of the molecule which has a low surface tension, and, thus, prevents wetting of the gold or other noble metal by an epoxy adhesive component. Other chemical moieties, such as disulfides having a general formula of R—S—S—R', where R and R' are the same or different hydrocarbon moieties, such as $(CH_2)_x$ or substituted chains, could be used to form the SAMs.

The SAMs, once they provide protection from the bleed of the die attach adhesives, self desorb or are otherwise removed from the gold surface during the wire bonding temperatures, thus rendering the gold surface free from any organic layer which would interfere with wire bonding process. The composition is applied as a coating, preferably in a solvent such as butylcarbitol.

DESCRIPTION OF THE PREFERRED EMBODIMENT(S)

Figure 1:
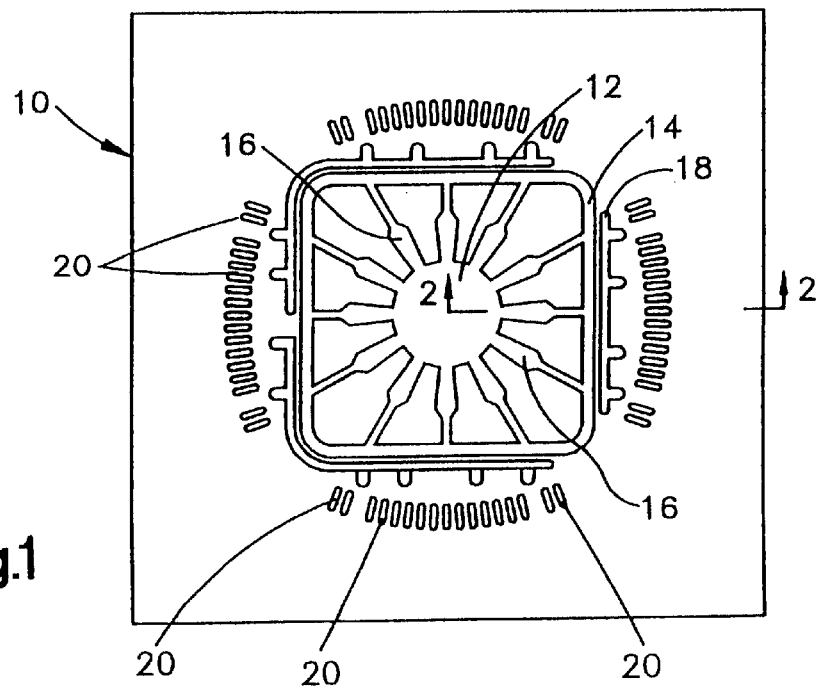
FIG. 1 is a top plan view of a planar chip carrier after coating the gold surfaces thereon to form a SAM according to this invention and before the attachment of an I/C chip.

Referring now to the drawings, and, for the present, to FIG. 1, a planar chip carrier for use in the present invention is shown The chip carrier includes an organic dielectric substrate 10 which has formed thereon a central die attach pad 12 which is connected to a ground ring 14 by fingers 16. A voltage or power ring 18 is also provided, as well as wire bond pads 20 on the surface of the substrate 10. All of the central die pad 12, ground ring 14, fingers 16, voltage or power ring 18, and wire bond pads 20, preferably are formed of gold, although other noble metals, such as palladium, platinum or silver, may be used in some instances. However, gold is the preferred material for these structures.

To attach an I/C chip or die 24 (FIG. 3), an adhesive (not shown) is applied to the surface of the central die attach pad 12, and the die 24 is then mounted to the central die attach pad 12. A particularly useful adhesive for attaching the die 24 is a two part epoxy adhesive, such as Ablestick 965-IL, manufactured by Ablestick Corp. During this mounting process, there is a tendency for the adhesive to bleed during the attach period and to spread out from the attach surface 12 onto the fingers 16, the ground ring 14. Ground ring 14 is the first wire bondable gold surface that the die attach adhesive comes in contact with but, depending on how the substrate is configured, gold surfaces 18 and 20 may be affected. This is because the surfaces of uncontaminated gold have a surface tension which is extremely high, i.e. in the range of 1,200 to 1,500 dynes/cm. This is much higher than the surface tension of the epoxy and, thus, the epoxy, or components thereof, would bleed thereon, thereby wetting this surface. Therefore, during subsequent processing of attaching wires to the wire bond surface by compressive wire bonding, a good bond of the wire to the surface could not be assured.

Figure 2:
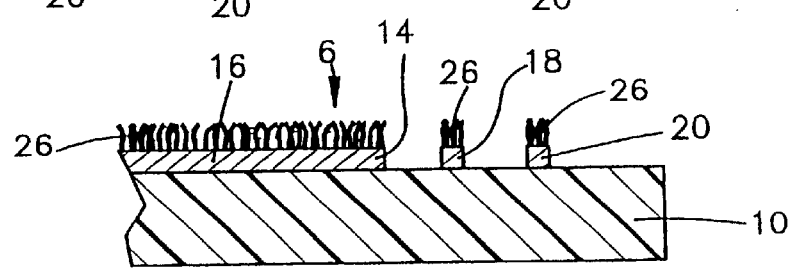
FIG. 2 is a sectional view taken substantially along the plane designated by the line 2—2 of FIG. 1.
Figure 3:
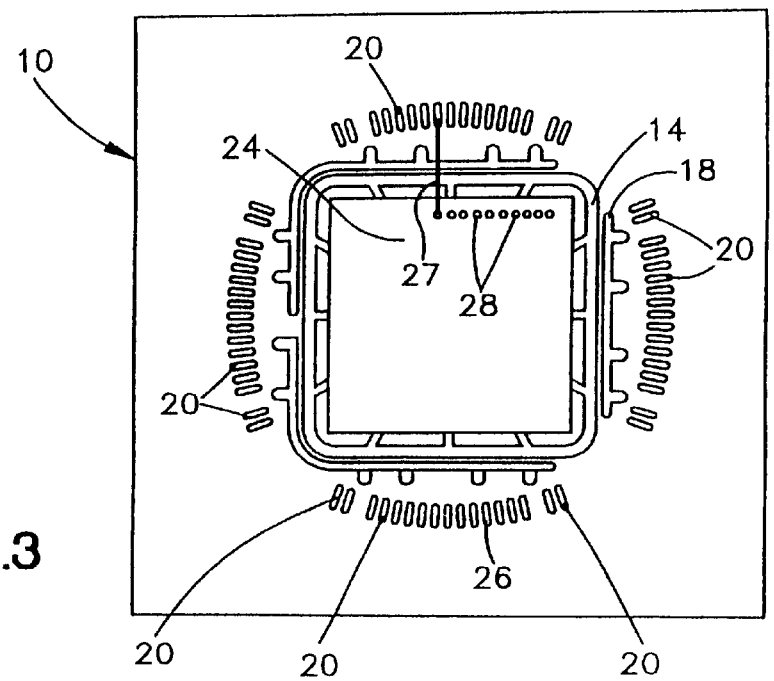
FIG. 3 is a view similar to FIG. 1 with an I/C chip attached.

To overcome this problem, the surface of the central die attach 12, the ground ring 14, fingers 16, the voltage ring 18, and the wire bond pads 20, are treated with a chemical composition which will produce on the gold surface a "Self-Assembled Monolayer" (SAM) 26 (FIG. 2). The chemical composition is generally characterized by a group that has an affinity to bond to gold or other noble metal, and is connected to one or more hydrocarbon groups, which terminate in hydrophobic and oleophobic groups. Preferably, the groups that bond to the gold are thiol or other sulfur containing groups, such as disulfides. These compositions have the general formulae of HS—R or R—S—S—R', where R and R' may be the same or different, and are hydrocarbon moieties such as $(CH_2)_n$ or substituted $(CH_2)_n$ chains which may be terminated with a methyl or fluorinated methyl group, which have hydrophobic and oleophobic characteristics. In the case of the HS—R molecule, the HS group attaches to the gold. In the case of a disulfide molecule, the bond between the sulfur atoms is believed to cleave, leaving two molecules, both of which can attach through the sulfur to the gold depending upon the resulting $(CH_2)_n$ or substituted $(CH_2)_n$ chain lengths as to which will predominate. The gold surface then takes on the characteristics of the hydrocarbon surface, which can have a surface tension as low as about 18 dynes/cm, which is lower than the surface tension of the epoxy used. A particularly useful class of compounds are those in the classes $(HS(CH_2)_nX)$ wherein n is an integer preferably from 1 to 21, and x is methyl, ethylene or fluorinated methyl terminated group. Such compositions are described in the publication "Thin Films, Self Assembled Monolayers of Thiols", edited by Abraham Ulman, Vol. 24, at pages 14–17, which is incorporated herein by reference. The hydrocarbon groups listed on page 15 under low-energy surfaces produce such low-energy surfaces. Alkyl thiols and disulfides that terminate in non-polar groups absorb onto gold and other noble metal surfaces and have hydrophobic and oleophobic characteristics. Thus, these are the preferred compositions. A particularly useful thiol is 1-octadecanethiol $[HS—(CH_2)_{17}—CH_3]$. (Mercaptans tend to oxidize to disulfides if left standing for a period of time.) This chemical composition preferably is applied either by spraying or dipping or otherwise coating the entire surface of the substrate 10 with the chemical composition that forms the SAM 26. The SAM 26 on the gold surfaces, as shown in FIG. 2, will protect the gold surfaces from any bleed from the adhesive wetting the gold surfaces when an I/C chip 24 is attached, as shown in FIG. 3. SAMs will not form on the organic substrate material 10.

When it is time to perform the wire bonding, which is at a temperature of at least about 120° C. and higher for compressive wire bonding, the SAM material 26 will desorb from the various gold surfaces and allow the wire bond to take place, as shown in FIG. 3, one of which wires is shown at 27 extending from pad 28 on I/C chip 24 to a wire bond pad 20. It is to be understood that wire bonding can take place between the pads 28 on the chip 24 and either or both the ground ring 14 or voltage ring 18.

Figure 4:
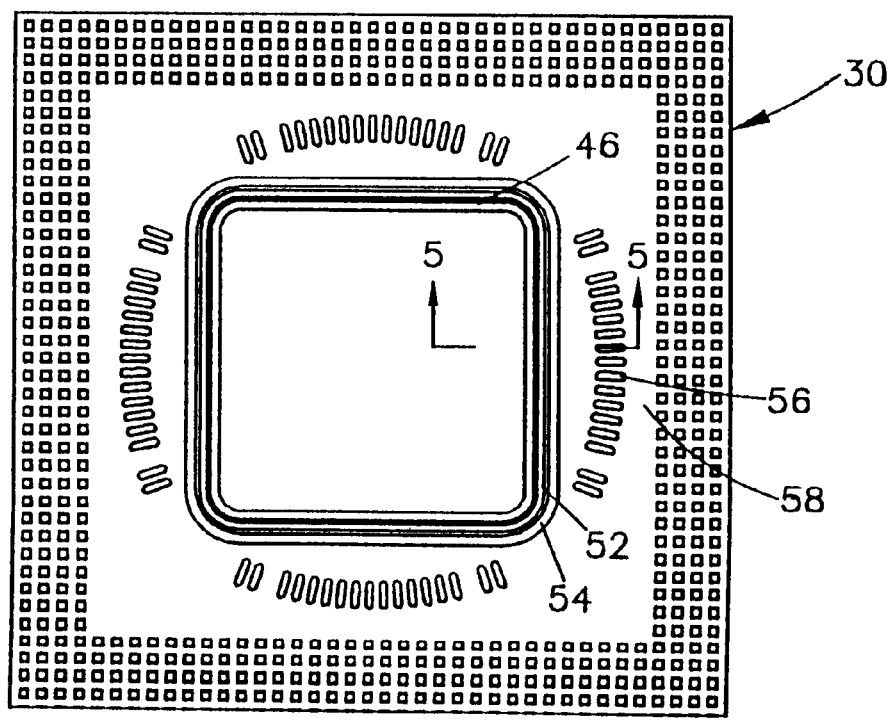
FIG. 4 is a top plan view of a chip carrier with a cavity configuration for the reception of an I/C chip after treatment of the gold surfaces to form a SAM according to this invention.
Figure 5:
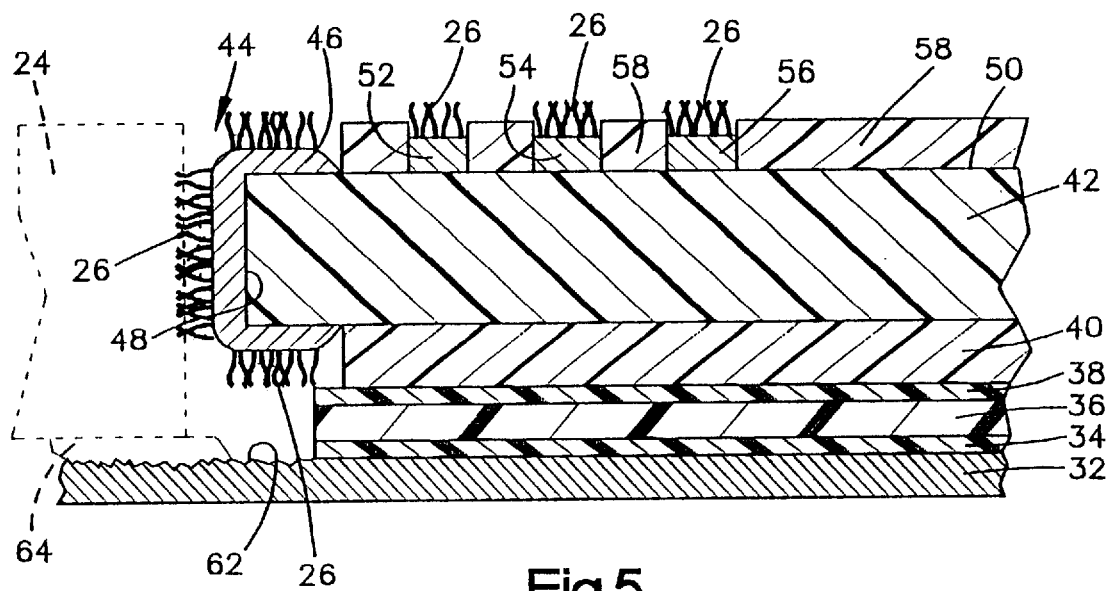
FIG. 5 is a sectional view taken substantially along the plane designated by the line 5—5 of FIG. 4.
Figure 6:
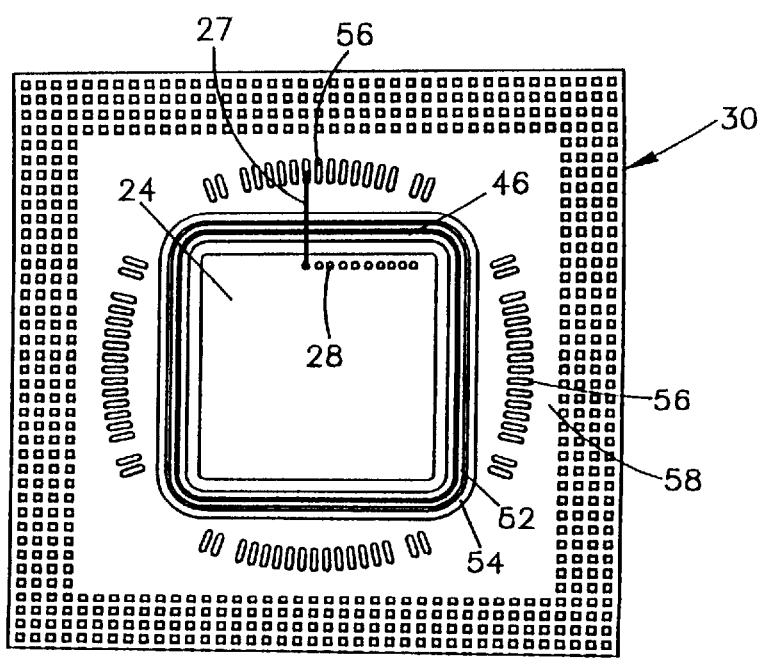
FIG. 6 is a view similar to FIG. 4 with an I/C chip attached thereto.

Referring now to FIGS. 4 through 6, another embodiment of a laminate chip carrier is shown. This chip carrier is of the cavity type with the chip being mounted in the cavity. The chip carrier includes a substrate 30 which includes a stiffener 32 having an adhesive 34 which attaches a polyimide dielectric sheet of material 36 thereto. A second layer of adhesive 38 attaches a soldermask 40 thereto, and a dielectric laminate 42 is attached to the soldermask 40. The stiffener 32 is preferably formed of copper or nickel clad copper. The laminate preferably is an FR-4 material comprised of a glass filled epoxy, as is well known in the art. A cavity 44 extends through the laminate 42, the soldermask 40, the adhesive 38, the polyimide 36, the adhesive 34, to the stiffener 32, on which the die or I/C chip 24 will be mounted, as will be described presently. The laminate 42 has a gold band 46 formed on interior surface 48 thereof, which surrounds the upper portion of the cavity 44. Laminate 42 also has a top surface 50 on which is formed a ground ring 52, a voltage ring 54 and wire bond pads 56, which are separated by soldermask 58. The ground ring 52, the voltage ring 54 and wire bond pads 56, which are wire bond surfaces, all are metal, preferably gold.

As can be seen in FIGS. 5 and 6, an I/C chip 24 is bonded to the top surface 62 of stiffener 32, (i.e. the surface is exposed in the cavity 44 of the substrate 30) by an epoxy 64. The epoxy 64 preferably is a two component epoxy, such as Ablestick 965-IL, the same as the epoxy described with respect to FIG. 3. As previously described, in order to prevent bleed of the epoxy 64, all of the surfaces of the gold. band 46, the ground ring 52, voltage ring 54 and gold wire bond pads 56, are treated with a chemical composition which will form a SAM 26 (FIG. 5) in the same manner and with the same composition as described with respect to FIGS. 1–3. This will prevent bleed from the epoxy 64 from wetting the surface of the various gold or other noble metal surfaces since the sulfur or thiol moieties will adhere to the surface with a chemical bond, thus presenting an outward low surface tension surface of hydrocarbon to the surrounding space.

As described previously, where bonding takes place, the SAM 26 will desorb from the gold surfaces and allow the wire bond to take place, as shown in FIG. 6, one of which wires is shown at 27 extending from pad 28 on the I/C chip 24 to wire bond pad 56.

It is to be understood that various modifications of the above-described embodiments can be made, for example, rather than relying on the processing temperatures during wire bonding.

What is claimed is:

1. A method of preventing the bleeding of an adhesive component onto noble metal of a wire bond surface on a dielectric substrate when bonding an electrical component thereto comprising the steps of:

contacting the noble metal surface with a chemical composition that will provide a Self-Assembled Monolayer (SAM) on said wire bond surface, wherein said chemical composition is an alkyl thiol or disulfide that terminates in a non-polar group; and thereafter bonding said component to said substrate with an adhesive having a higher surface tension than the resulting SAM.

2. The invention as defined in claim 1 wherein said chemical composition has the formula HS—R or R—S—S—R', wherein R and R' are the same or different hydrocarbon moieties selected from the group of $(CH_2)_n$ and substituted $(CH_2)_n$ terminated with a methyl or fluorinated methyl group.

3. The invention as defined in claim 2 wherein said chemical composition is selected from the group $(HS(CH_2)_nX)$ wherein n is an integer and X is a methyl, ethylene, or fluorinated methyl terminated group.

4. The invention as defined in claim 3 wherein said integer is from 1 to 21.

5. The invention as defined in claim 4 wherein said chemical composition is $[HS-(CH_2)_{17}-CH_3]$.

6. The invention as defined in claim 1 wherein said noble metal surface is a wire bond surface on a chip carrier.

7. The invention of claim 6 further characterized by wire bonding a wire to said wire bond surface.

8. The invention as defined in claim 1 wherein said electrical component is an I/C chip.

9. The invention as defined in claim 8 wherein said dielectric substrate is an organic material.

10. The invention as defined in claim 9 wherein said substrate has a cavity therein in which said I/C chip is bonded.

11. The invention as defined in claim 6 wherein said wire bond surface is selected from the group voltage ring, ground ring, and wire bond pad.

12. The invention as defined in claim 9 wherein said dielectric substrate is free of SAM.

13. The invention as defined in claim 1 wherein the adhesive is an epoxy.

* * * * *